(12) United States Patent
Horning et al.

(10) Patent No.: US 7,396,698 B2
(45) Date of Patent: Jul. 8, 2008

(54) METHODS AND SYSTEMS FOR PROVIDING MEMS DEVICES WITH A TOP CAP AND UPPER SENSE PLATE

(75) Inventors: Robert D. Horning, Savage, MN (US); Jeffrey A. Ridley, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 24 days.

(21) Appl. No.: 11/323,233

(22) Filed: Dec. 30, 2005

(65) Prior Publication Data
US 2006/0110854 A1 May 25, 2006

Related U.S. Application Data

(62) Division of application No. 10/689,801, filed on Oct. 21, 2003, now Pat. No. 7,005,732.

(51) Int. Cl.
*H01L 21/00* (2006.01)
(52) U.S. Cl. .................. 438/48; 257/678; 257/704
(58) Field of Classification Search ............ 438/48
See application file for complete search history.

(56) References Cited

U.S. PATENT DOCUMENTS

| | | | |
|---|---|---|---|
| 4,093,021 A | 6/1978 | Groom | |
| 4,445,274 A | 5/1984 | Suzuki et al. | |
| 4,458,296 A | 7/1984 | Bryant et al. | |
| 4,541,003 A | 9/1985 | Otsuka et al. | |
| 6,036,872 A | 3/2000 | Wood et al. | |
| 6,169,658 B1 | 1/2001 | Arena et al. | |
| 6,278,611 B1 | 8/2001 | Arena et al. | |
| 6,317,248 B1 * | 11/2001 | Agrawal et al. | 359/265 |
| 6,582,985 B2 | 6/2003 | Cabuz et al. | |
| 6,939,473 B2 * | 9/2005 | Nasiri et al. | 216/2 |
| 2005/0079684 A1 * | 4/2005 | Chong et al. | 438/455 |
| 2006/0162145 A1 * | 7/2006 | Verger et al. | 29/525.11 |
| 2006/0162146 A1 * | 7/2006 | Shcheglov et al. | 29/594 |

* cited by examiner

*Primary Examiner*—Michelle Estrada
*Assistant Examiner*—Ankush K Singal
(74) *Attorney, Agent, or Firm*—Black Lowe & Graham, PLLC

(57) ABSTRACT

A method for fabricating a MEMS device having a top cap and an upper sense plate is described. The method includes producing a device wafer including an etched substrate, etched MEMS device components, and interconnect metal, a portion of the interconnect metal being bond pads and adding a metal wraparound layer to a back side, edges, and a portion of a front side of the device wafer. The method also includes producing an upper wafer including an etched substrate and interconnect metal, bonding the device wafer and the upper wafer, and dicing the bonded upper wafer and device wafer into individual MEMS devices.

11 Claims, 10 Drawing Sheets

METHODS AND SYSTEMS FOR PROVIDING MEMS DEVICES WITH A TOP CAP AND UPPER SENSE PLATE

CROSS REFERENCE TO RELATED APPLICATIONS

This application is a divisional application of U.S. patent application Ser. No. 10/689,801, filed Oct. 21, 2003 now U.S. Pat. No. 7,005,732, which is hereby incorporated by reference in its entirety.

GOVERNMENT INTEREST

The invention described herein was made in the performance of work under U.S. Government Contract No. DAAE30-01-9-0100. The Government may have rights to portions of this invention.

BACKGROUND OF THE INVENTION

This invention relates generally to micro-electromechanical systems (MEMS) devices and processes, and more specifically to processes for providing MEMS devices which incorporate top caps or covers with upper sense plates.

One method of producing micro-electromechanical structures (MEMS) is by bonding a patterned silicon wafer to a glass (usually pyrex) substrate. Portions of the silicon wafer are etched away, leaving a mechanical silicon structure anchored to the glass substrate. The process is initiated with a glass wafer. A cavity is formed in the wafer using a wet or dry etching process. A depth of the etch determines a separation between the structure's capacitive elements. Metal layers are deposited and patterned on the glass, forming conductive electrodes and interconnects. A heavily boron doped (p++) epitaxial layer is grown on a separate, lightly doped silicon substrate. A pattern is etched into the silicon wafer to a depth greater than the thickness of the epitaxial layer. The glass and silicon wafers are bonded together using anodic bonding. Using an etchant that etches lightly doped silicon but not p++ silicon, the undoped portion of the silicon substrate is etched away, leaving the freestanding microstructures. Such a process is generally referred to herein as a silicon-glass MEMS process.

In most known MEMS devices, the microstructure is exposed to the ambient environment during operation. At least some of the known problems associated with exposed microstructures are described below. Furthermore, if it is desired to provide a special operating environment, or simply protect the microstructure from the ambient environment, the protection must be done at a packaging step.

One known packaging step is to bond a glass wafer containing recesses, sometimes referred to as an upper wafer or top cap, on top of the previously fabricated glass/silicon wafer, which is then sometimes referred to as a device wafer. At least part of the silicon structure on the device is a continuous support ring that completely surrounds, but may or may not be connected to, the microstructure. The second glass wafer is bonded to the seal ring, forming the cavity. In addition, it is desirable to have electrical leads extending from outside the cavities into the cavities. While such methods and devices have been contemplated, they have not yet been successfully integrated into a manufacturing environment.

BRIEF SUMMARY OF THE INVENTION

In one aspect, a method for constructing a micro-electromechanical systems (MEMS) device having a top cap and an upper sense plate is provided. The method comprises producing a device wafer including an etched substrate, etched silicon device components, and interconnect metal, a portion of the interconnect metal being bond pads, and adding a metal wraparound layer to a back side, edges, and a portion of a front side of the device wafer. The method further comprises producing an upper wafer including an etched substrate and interconnect metal, bonding the device wafer and the upper wafer, and dicing the bonded upper wafer and device wafer into individual MEMS devices.

In another aspect, a top cap for a micro-electromechanical systems (MEMS) device is provided which comprises a substrate comprising a surface and recesses formed in the surface and interconnecting metal deposited into and extending out of the recesses and onto the surface. The top cap further comprises at least one deep recess comprising a recess formed in the surface of the substrate, and configured to be above a bond pad of a device wafer onto which the top cap is to be bonded.

In still another aspect, a micro-electromechanical systems (MEMS) device wafer is provided which comprises a substrate comprising a front side including a surface, a back side, edges extending between the front side and the back side, and recesses formed in the surface. The device wafer also comprises interconnecting metal deposited into and extending out of the recesses and onto the surface, a MEMS device formed from silicon and bonded to the substrate, and a wrap around metal layer deposited on the back side and the edges of the device wafer. The wrap around metal layer is also extending onto a portion of the front side of the device wafer.

In yet another aspect, a micro-electromechanical systems (MEMS) device comprising a device wafer and an upper wafer is provided. The device wafer comprises a substrate comprising a front side including a device wafer surface, a back side, edges extending between the front side and the back side, and recessed trenches formed in the device wafer surface. The device wafer also comprises interconnecting metal deposited into and extending out of the recessed trenches and onto the device wafer surface and forming at least one bond pad. A MEMS structure formed from silicon and bonded to the substrate and a wrap around metal layer deposited on the back side, the edges of the device wafer, and onto a portion of the front side are also part of the device wafer. The upper wafer is, bonded to the device wafer and comprises a top cap substrate comprising an upper wafer surface and recesses formed in the upper wafer surface. The upper wafer also comprises interconnecting metal deposited into and extending out of the recesses and onto the upper wafer surface and at least one deep recess. The deep recess comprises a recess formed in the upper wafer surface which is positioned above the bond pad.

In another aspect, a method for preventing electrical shorts in a MEMS device including at least one electrical interconnection passing under a support ring is provided. The electrical interconnection is in a recessed trench and a material filling the trench onto which the support ring is mounted is also provided. The method comprises forming a protective shield near the support ring which reduces incidents of particles shorting the support ring to the electrical interconnection.

DETAILED DESCRIPTION OF THE INVENTION

Figure 1:
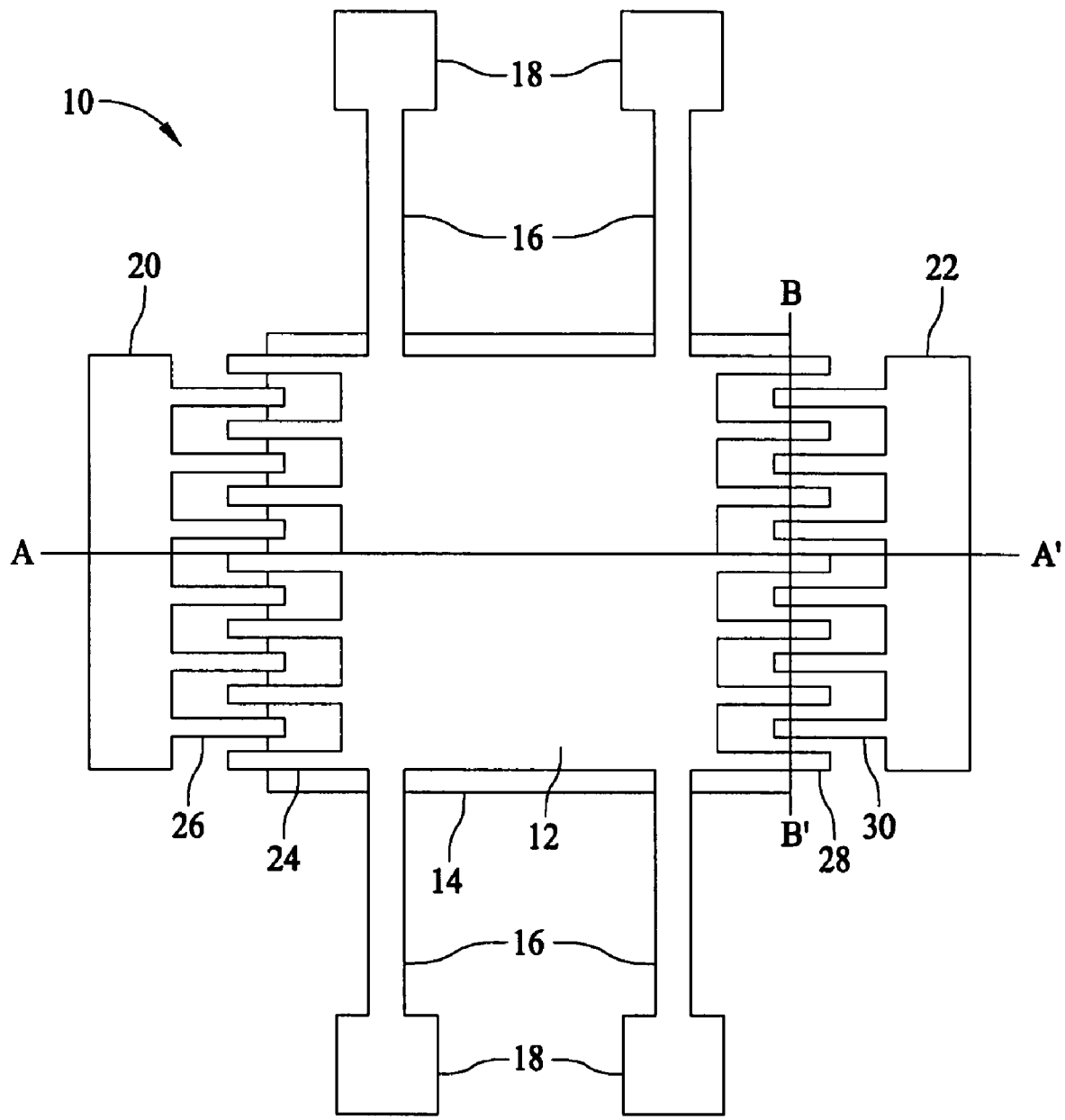
FIG. 1 is an illustration of a MEMS device.

FIG. 1 is an illustration of a micro electromechanical system (MEMS) device 10 which represents a large class of known MEMS devices. MEMS device 10 includes a proof mass 12 suspended over a sense plate 14. Sense plate 14 is formed on a substrate (not shown). Proof mass 12 is suspended over sense plate 14 utilizing a plurality of beams or suspensions 16 which are attached to anchors 18 attached to the substrate. A motor drive comb 20 and 26 and a motor pickoff comb 22 and 30 are attached to the substrate. Proof mass 12 includes a plurality of extending fingers 24 which interleave with fingers 26 extending from motor drive comb 20. Proof mass 12 further includes a plurality of extending fingers 28 which interleave with fingers 30 extending from motor pickoff comb 22. Operation of such devices is well known, and multiple variations on the above described MEMS device 10 exist. It is further known that multiple MEMS devices 10 might be utilized in a platform, for example, a MEMS gyroscope. Also it is known that MEMS devices 10 are utilized in multiple platforms, for example, gyroscopes, accelerometers, resonators, temperature sensors, and pressure sensors. While sometimes described herein in the context and structure of a MEMS gyroscope, it is contemplated the descriptions and structures described herein are applicable for the other MEMS devices listed above.

Figure 2:
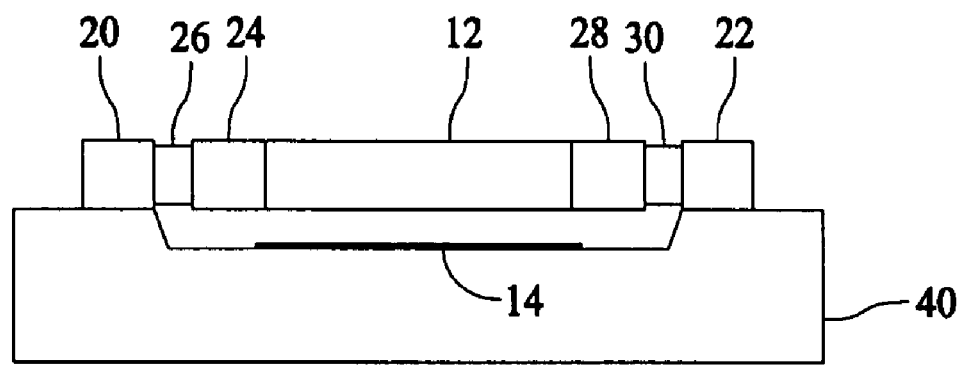
FIG. 2 is a cross-sectional view illustration of the MEMS device of FIG. 1 along line A-A'.

FIG. 2 is a side view of MEMS device 10 which is a cross-section through line A-A' as shown in FIG. 1 illustrating that proof mass 12 is suspended above sense plate 14. The interleaved fingers 24 of proof mass 12 extend toward motor drive comb 20 and its fingers 26. The interleaved fingers 28 of proof mass 12 extend toward motor pickoff comb 22 and its fingers 30. Further illustrated is a substrate 40 on which motor drive comb 20, motor pickoff comb 22, and sense plate 14 are placed. As FIG. 2 is a cross section, interleaved fingers 26 and 28 are shown in a hidden view.

Figure 3:
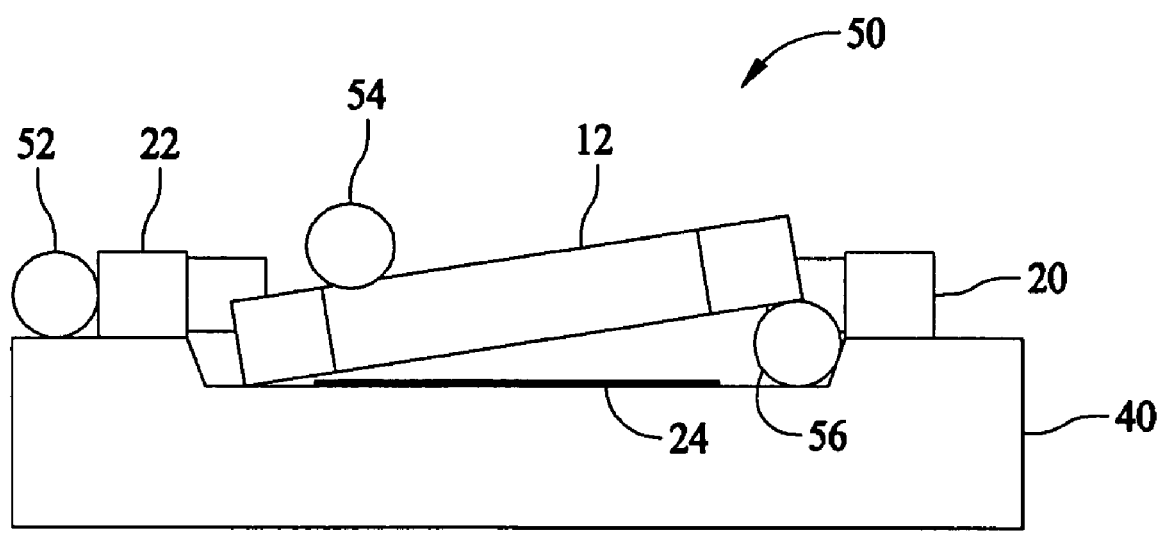
FIG. 3 is a side view of the MEMS device of FIG. 2 illustrating effects of loose particles within the MEMS device.

FIG. 3 illustrates potential operational problems for MEMS device 10 resulting from particles engaging exposed portions of MEMS device 10. For example, a particle 52 may create a short circuit between motor pickoff comb 22 and another electrical component (not shown) of MEMS device 10. In another example, a particle 54 is attached to proof mass 12, and changes a mass of a portion of proof mass 12, weighting that portion down as shown. In a further example, a particle 56 is lodged between proof mass 12 and substrate 40, which can prevent a motion of proof mass 12. It is known that by placing a cover over MEMS devices similar to MEMS device 10, occurrences of particles similar to particles 52, 54, and 56, and the operational problems their occurrences cause, can be reduced.

Figure 4:
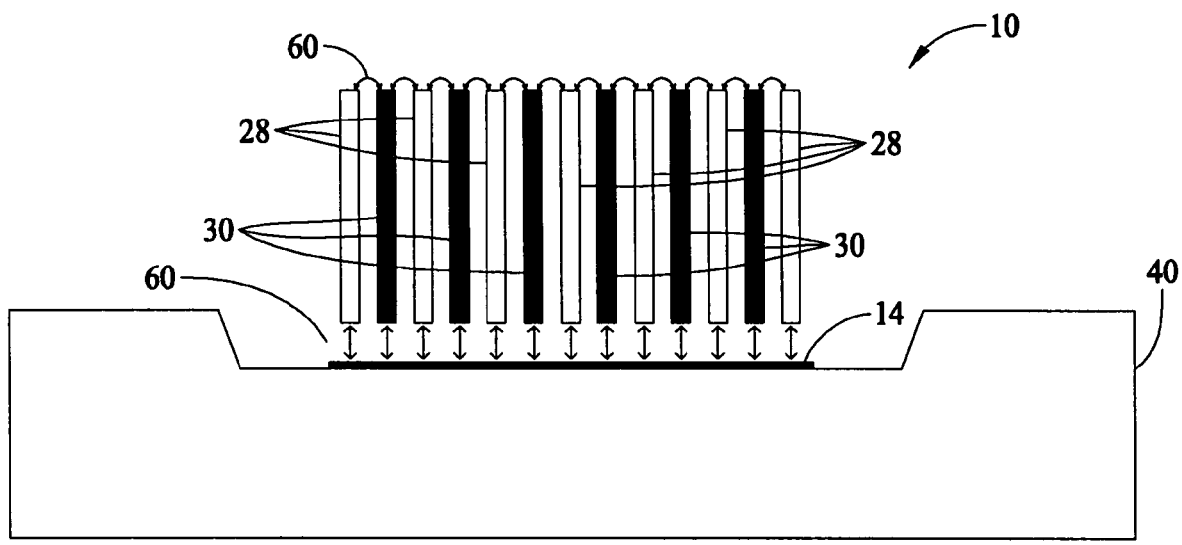
FIG. 4 is a cross-sectional view illustration of the MEMS device of FIG. 1 along line B-B' illustrating electrical fields within the MEMS device.

FIG. 4 is a cross section of MEMS device 10 taken along line B-B' as shown in FIG. 1 which illustrates another problem which occurs with exposed MEMS structures. While exaggerated in scale, the cross section is through interleaved fingers 28 of proof mass 12 and interleaved fingers 30 of motor pickoff comb 22. To operate MEMS device 10, or any other MEMS device, fingers 28 are biased at a voltage that is different than the voltage at which fingers 30 are biased. Double headed arrows 60 represent electric field lines between fingers 28 and fingers 30. However, there is a difference in the electric field lines 60 above fingers 28 and fingers 30, and the electric field lines 60 below fingers 28 and fingers 30. The difference in the electric field lines 60 is due to the presence of a metal film (sense plate 14) below fingers 28 and fingers 30 and the absence of a similar film above fingers 28 and fingers 30. This asymmetry between the electric fields can degrade performance of some MEMS devices.

Figure 5:
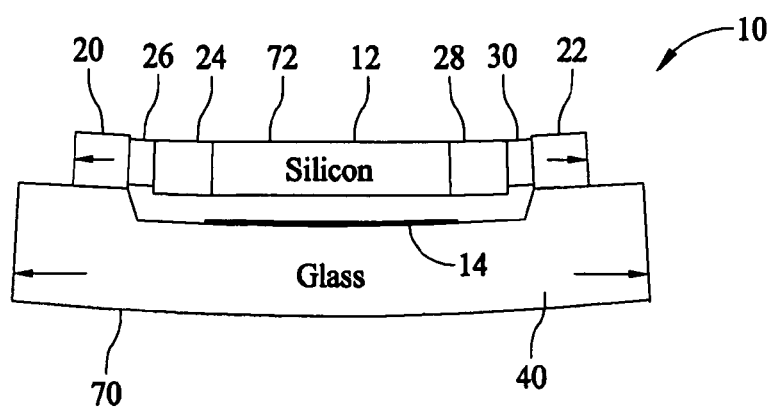
FIG. 5 is a side view of the MEMS device of FIG. 2 illustrating effects of temperature changes on the MEMS device.

Another problem with exposure known to affect MEMS device 10 is temperature changes, effects of which are illustrated in FIG. 5. Stress can be induced by various environmental factors. For example, if the temperature in which a MEMS device 10 operates changes, a differential thermal expansion between a glass portion 70 and a silicon portion 72 causes stress gradients and deformation as illustrated. Substrate 40 is constructed from glass portion 70 and proof mass 12, motor drive comb 20 and motor pickoff comb 22 (all shown in FIG. 1) are constructed from silicon portion 72.

Figure 6:
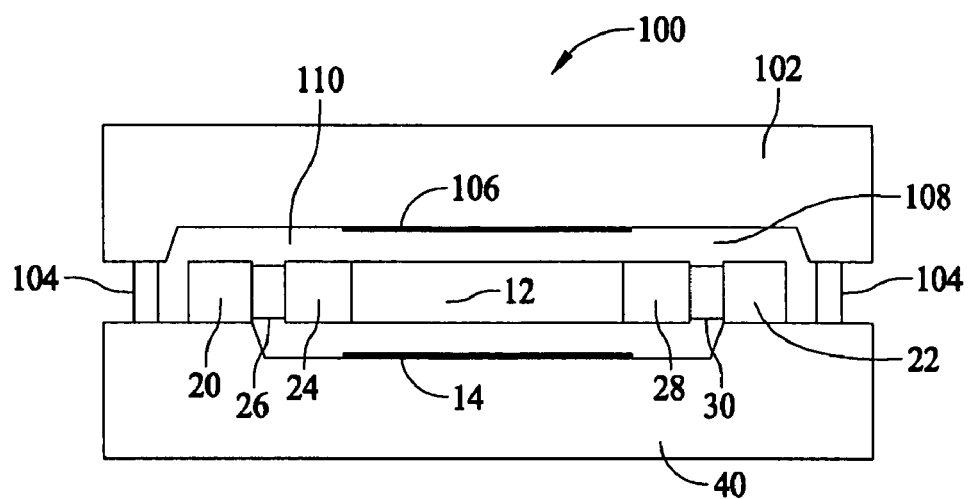
FIG. 6 is a side view of a MEMS device having a top cap and an upper sense plate.

The particulate problems illustrated in FIG. 3 and above described are solved as illustrated in FIG. 6 in the cross sectional view of MEMS device 100. Components of MEMS device 100, identical to components of MEMS device 10 (shown in FIGS. 1-5), are identified in FIG. 6 and subsequent Figures using the same reference numerals used in FIGS. 1-5. MEMS device 100 includes a top cap 102 which provides a top for MEMS device 100 and covers proof mass 12, motor drive comb 20 and motor pickoff comb 22. In one embodiment, top cap 102 is attached to substrate 40 via a ring 104 which is formed on substrate 40 and encompasses the components of MEMS device 100, and patterned into the same layer of material as proof mass 12, sense plate 14, motor drive comb 20 and motor pickoff comb 22 and their respective fingers 24, 26, 28, and 30. In addition, top cap 102 includes an upper sense plate 106, which in one embodiment, is placed within a recess 108 formed into top cap 102. In a specific embodiment, ring 104 provides support for and is anodically bonded to top cap 102 to provide a hermetically sealed area 110, sometimes referred to as cavity 110, for operation of the components of MEMS device 100. However, cavity 110 does not need to be hermetically sealed.

Figure 7:
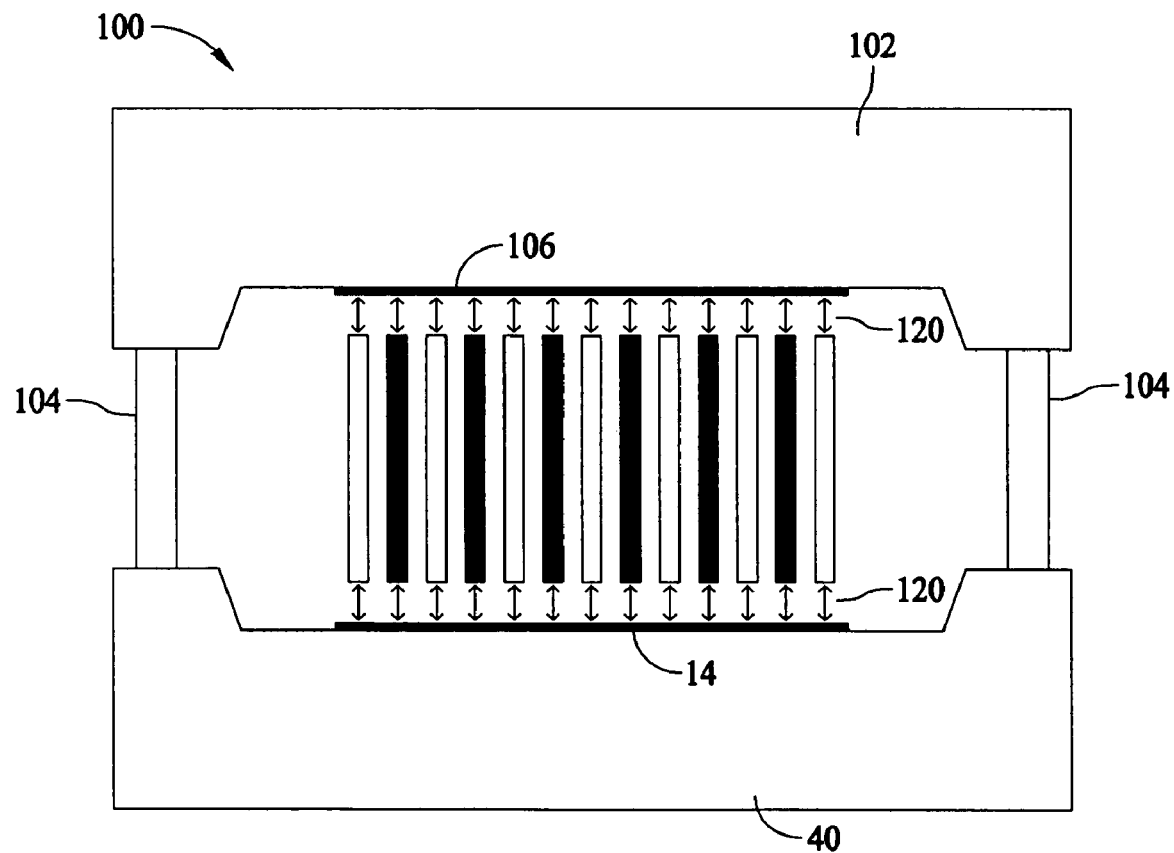
FIG. 7 is another side view of the MEMS device of FIG. 6 illustrating the effect of an upper sense plate on the electrical fields within the MEMS device.

FIG. 7 is another cross sectional view of MEMS device 100 including top cap 102. As described above, utilization of top cap 102 may provide a hermetically sealed area 110. However, cavity 110 need not be hermetically sealed. Utilization of top cap 102 and ring 104 is sufficient to provide the desired reduction in exposure of the components of MEMS device 100, as long as any openings into cavity 110 are small enough that no particulates (e.g. particles 52, 54, and 56 (shown in FIG. 3) can get in. In addition, in the embodiment of top cap 102 that includes patterned metal films on it (i.e., upper sense plate 106), the electric field asymmetry issues discussed with respect to FIG. 4 can be eliminated. As illustrated in FIG. 7, electric field lines 120 between fingers 24 and 26 and sense plate 14 are symmetric with electric field lines 120 between fingers 24 and 26 and upper sense plate 106. Therefore when using an upper sense plate 106, electric field lines 120 are symmetric on top and bottom sides of fingers 24 and 26, (and 28 and 30 (not shown in FIG. 7)). Also, the mechanically symmetric structure of MEMS device 100 eliminates, or at least minimizes, stress gradients caused by temperature changes, from top to bottom, minimizing the distortion to a MEMS device due to temperature changes as illustrated in FIG. 5.

Figure 8:
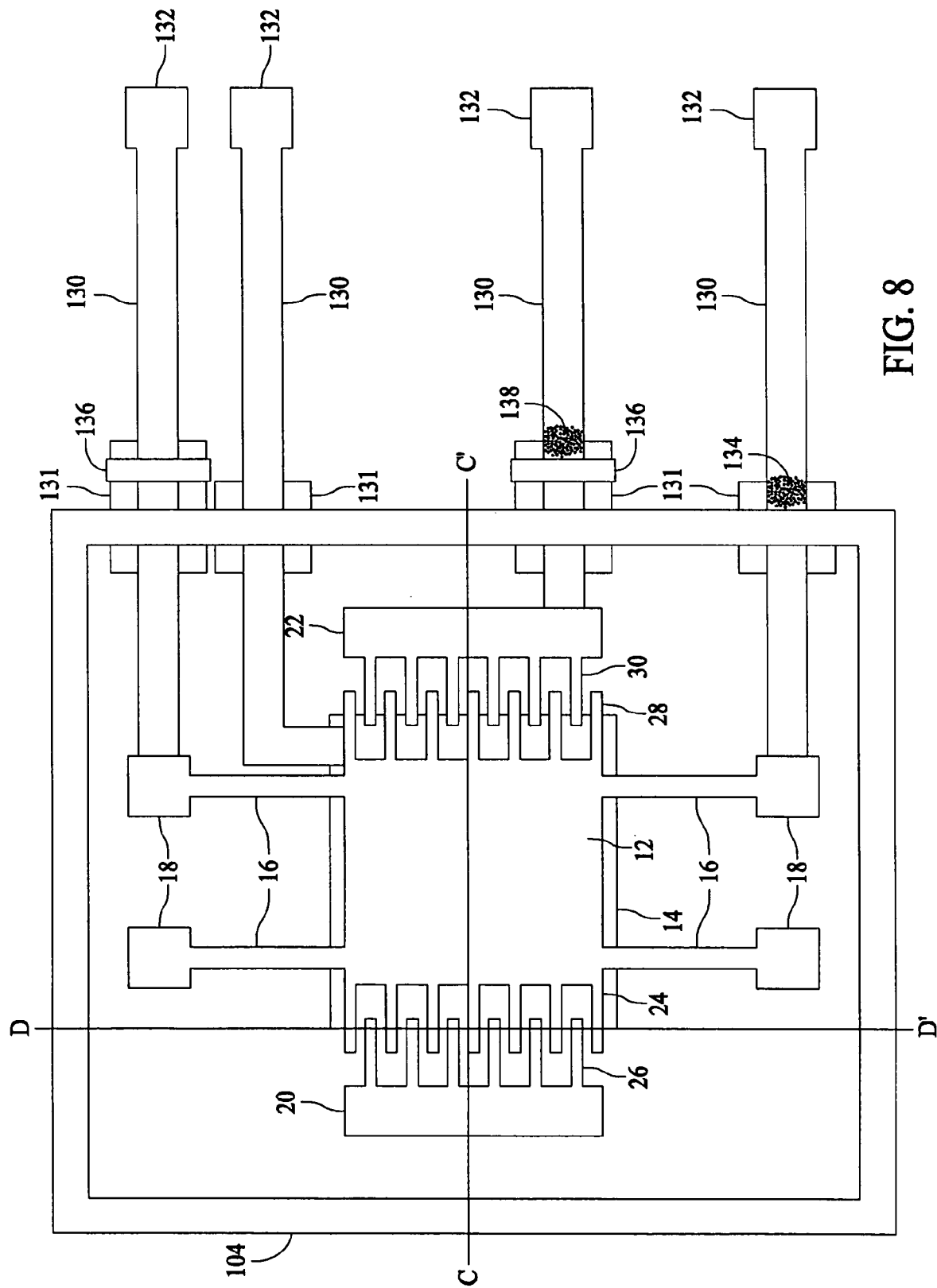
FIG. 8 is a top view of a MEMS device which incorporates a support ring and protective shields.

FIG. 8 is a schematic view of MEMS device 100 with top cap 102 and upper sense plate 106 removed. As shown in FIG. 8, a cross-sectional line C-C' is utilized to provide the cross sectional view of MEMS device 100 in FIG. 6. Similarly, a cross-sectional line D-D' is utilized to provide the cross-sectional view of MEMS device 100 in FIG. 7. Further, FIG. 8 illustrates ring 104 forming a perimeter around components of MEMS device 100. Not shown in FIGS. 6 and 7 are electrical connections 130 which extend through recessed trenches 131 under ring 104 from various components of MEMS device 100 to bond pads 132 which allow for connection to external devices. Benefits of MEMS device 100 with a top cap 102 (shown in FIG. 7) and upper sense plate 106 (shown in FIG. 7) are known, however, the known methods of fabricating a top cap 102 and upper sense plate 106 combination have not been amenable to manufacturing. In particular, process steps in need of improvement include a method of getting electrical signals from components of MEMS device 100 to bond pads 132 (i.e., the external connections) without electrical connection 130 creating short circuits. One known method of solving the short circuit problem was to fabricate large gaps (not shown) in support ring 104. These gaps minimize the probability of debris lodging in the ring, but allow water and saw debris into the cap 102 during a dicing process. However, both water and saw debris in cavity 110 are very undesirable.

FIG. 8 further illustrates one solution to the short circuiting problem and for reference illustrates how a particulate 134 can create a short circuit. As described above, the metal lines (electrical connections 130) run in trenches 131 under support ring 104 so that they do not short to support ring 104. However, if a particulate 134 lodges in an opening of recessed trench 131, it could short the metal to the support ring 104, as shown in the Figure. If other particulates 134 short additional electrical connections 130 to support ring 104, which is continuous around the entire device, those distinct electrical connections 130 will be shorted to each other. To prevent this problem, a protective shield 136 is shown as being added to at least some of the paths for electrical connections 130. As shown, protective shield 136 provides insulation by substantially preventing particulate 138 from touching support ring 104. Since protective shield 136 is not connected to any other piece of silicon (e.g. support ring 104), there is not a continuous electrical path to any other electrical connection 130. Protective shields 136, patterned in the silicon during production of a device wafer, and disconnected from any other silicon feature, are inserted to avoid the electrical shorts described above.

Another known problem with utilization of top cap 102 is the generation of sodium residue when bonding top cap 102 to ring 104. Current bonding methods, while very simple, produce a large quantity of sodium residue. One known solution includes rinsing the wafer on which MEMS devices 100 are fabricated with water during a dicing process. However, that process does not guarantee that all residue gets removed. As described above, water in cavity 110 is undesirable. Debris, residue, and components of MEMS device 100 sticking to one another are some of the problems associated with allowing water into the cavity 110, although water has been utilized to remove sodium during a dicing process, as described above.

Access to bond pads 132 has also been an issue in known MEMS devices 100 which incorporate top caps 102 and upper sense plates 106. For example, one known method of accessing bond pads 132 for connecting to external devices utilizes an ultrasonic drilling process to form holes (not shown) in top cap 102 prior to bonding to ring 104. These holes have chipped and cracked edges, and the drilling may have leaves residual stress in top cap 102.

Figure 9:
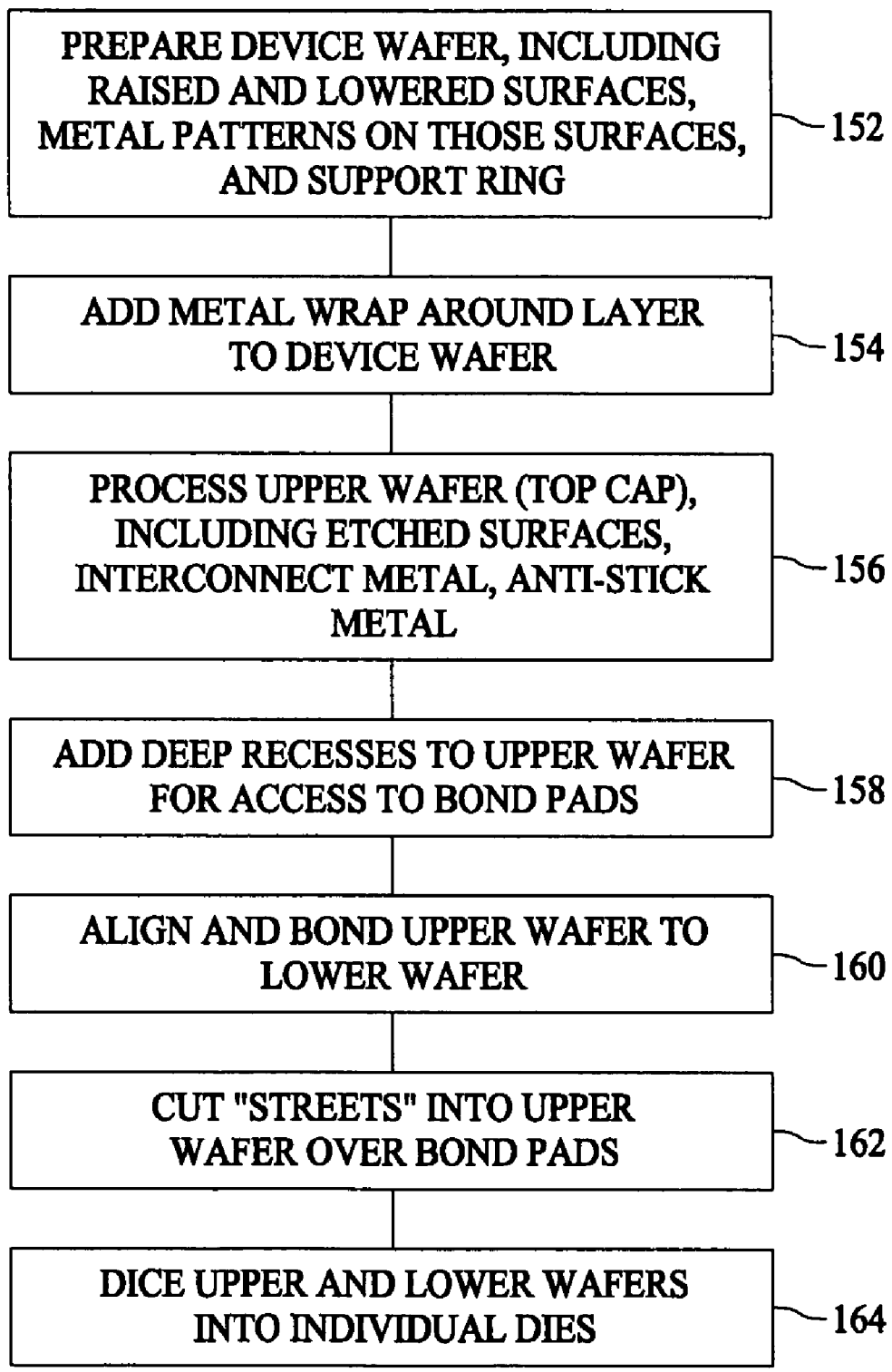
FIG. 9 is a flowchart describing a process for making MEMS devices with top caps and upper sense plates.

FIG. 9 is a flowchart 150 which diagrams a process for manufacturing a MEMS device including a top cap and upper sense plate which alleviates the above described manufacturing problems for such a MEMS device. Referring to flowchart 150, a device wafer is prepared 152, including raised and lowered surfaces on a glass substrate, silicon structures, and metal patterns (interconnect metal and anti-stick metal) on the glass surfaces for electrically connecting the MEMS device to external bond pads. The bond pads are outside a perimeter of a silicon supporting ring on the device wafer without shorting to the added supporting ring or to each other. Such features are added to the mask layout of the device wafer, but do not change the process flow of the device wafer. Further it is understood that a device wafer contains multiple dies, where each individual die includes the features described herein. A wrap-around metal layer is added 154 to the device wafer. The metal layer is a metal film on the back side of the device wafer that wraps around to the front side. Thus, there is a continuous electrical path from the back to the front of the device wafer.

An upper wafer is then processed 156 (processes for the device wafer and upper wafer could be performed in parallel). Processing 156 includes etching the surface of the upper wafer and adding interconnect metal and anti-stick metal to the etched surface. Deep recesses are added 158 to the upper wafer for eventual access to the bond pads on the device wafer. The upper wafer and device wafer are then aligned and bonded 160. Channels or "streets", which are deep recesses, are cut 162 into the upper wafer at locations that will align over the bond pads of the lower wafer to which external connections are to be made (further illustrated in FIGS. 15-17). The upper and device wafers are diced 164 into individual dies.

Figure 10:
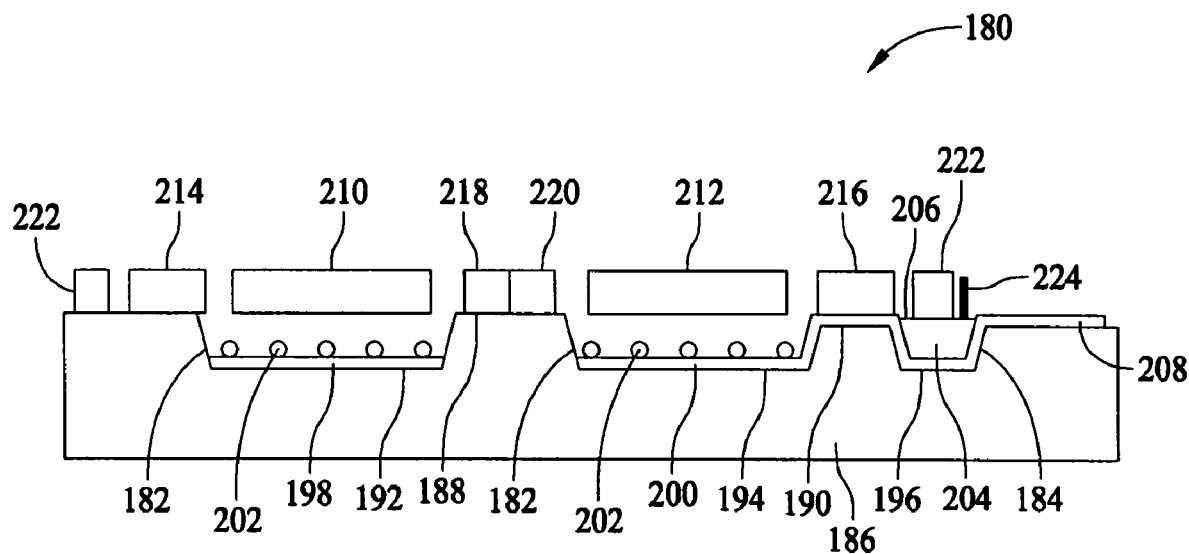
FIG. 10 is a side view of a device wafer of a MEMS device.

FIG. 10 illustrates a fabrication process for a device wafer 180 for MEMS devices, for example, MEMS gyroscopes (or accelerometers) which utilizes a top cap 102 and one or more upper sense plates. While FIGS. 1-8 illustrate a single die on a wafer, FIGS. 10-17 represent the entire wafer which can contain many individual die. Device wafer 180 includes a plurality of recessed trenches 182 and 184 etched into substrate 186. By patterning and etching, raised surfaces 188 and 190 and lowered surfaces 192, 194, and 196 are formed on substrate 186, which is usually a glass. Patterned metal features 198 and 200 are formed on a portion of these surfaces. Such metal patterns are utilized as sense plates, and to provide electrical connections to motor drive combs and motor pickoff combs, for example. Anti-stick metal pieces 202 are formed on patterned metal features 198 and 200 to prevent, for example, proof masses from sticking to a sense plate. While anti-stick metal pieces 202 are shown as being square, other geometric shapes for anti-stick metal pieces 202 may be utilized.

In one embodiment, recess 184, and the portion of metal feature 196 therein, are covered with a glass material 204, which provides a smooth surface 206 at the same level as raised surfaces 188 and 190. Part of metal 196 provides an electrical lead 208 to be utilized for an external connection. It is understood that device wafer 180 may include multiple recessed trenches 184, each having metal therein, and filled with glass material 204 to provide multiple electrical leads 208, each providing a connection to a different component of device wafer 180.

At the same time, a structure (e.g. components of a MEMS device) is patterned in a silicon wafer (not shown). The silicon wafer is bonded to substrate 186. The combined glass wafer and silicon wafer are etched, resulting in most of the silicon wafer being etched away, leaving only the patterned portion of the silicon wafer, firmly attached to substrate 186. Referring to FIG. 10, the patterned portion of the silicon wafer, attached to substrate 186, includes MEMS device components, for example, proof masses 210, 212, motor drive combs 214, 216, motor pickoff combs 218, 220, support ring 222, and protective shield 224. Support ring 222 encircles a perimeter of the components on device wafer 180. Support ring 222 is part of the support to which a top cap is bonded. Protective shield 224 operates to prevent conductive particulates (not shown) from contacting support ring 222, as described above with respect to protective shield 136 (shown in FIG. 8).

While it may be desirable, it is not necessary, to create recessed trenches 184 in substrate 186 wafer that pass underneath support ring 222. However, metal 200 in recessed trenches 184 carry electrical signals from components of a MEMS device to the bond pads (electrical lead 208). The bond pads are outside the cavity formed by support ring 222. Recessed trench 184 and metal 200 allow an electrical signal to pass into or out of the cavity without contacting support ring 222. If metal 200 contacted support ring 222, it would short various metal lines together and affect operation of the MEMS device. Also, if a particle, for example, debris from sawing device wafer 180 were to get lodged in the opening of the trench, it could short metal 200 to support ring 222.

Figure 11:
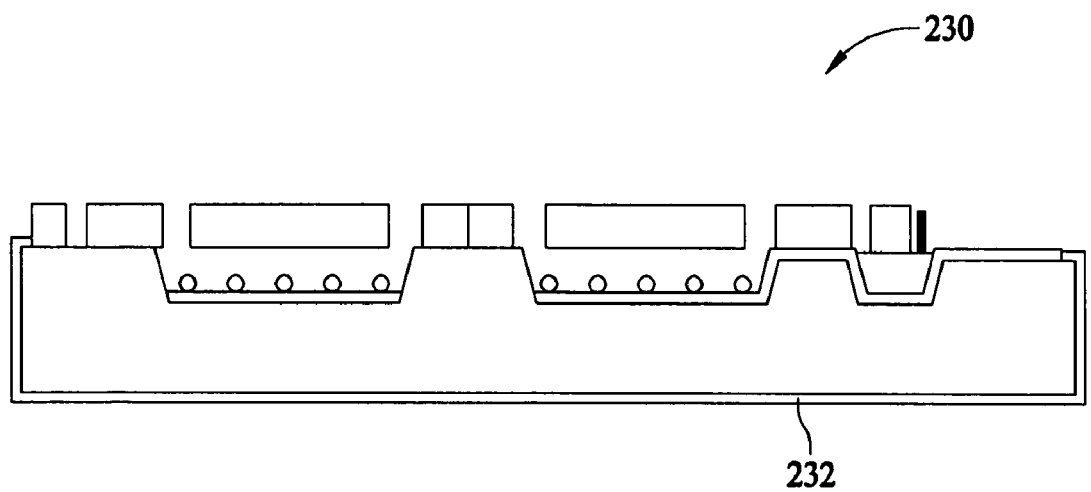
FIG. 11 illustrates a wrap around metal layer on the device wafer of FIG. 10.

FIG. 11 illustrates device wafer 230 which includes all of the components of device wafer 180, and further includes a wrap around metal layer 232 that provides a continuous electrical path from a front to a back of device wafer 230. While device wafers 180 and 230 are illustrated as being a portion of a single MEMS device, it is understood that device wafers 180 and 230 may include many portions of MEMS devices which are separated during a dicing process, where device wafers are cut into many individual dies, further described below. Therefore it is also understood that wrap around metal layer 232 wraps around an entire device wafer 230, rather than individual dies.

Figure 12:
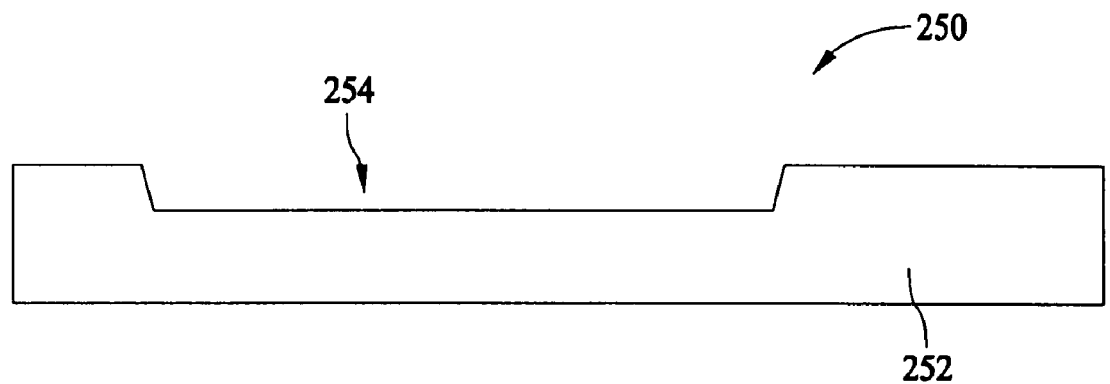
FIG. 12 illustrates recesses within a substrate to be utilized as a top cap for MEMS devices.
Figure 13:
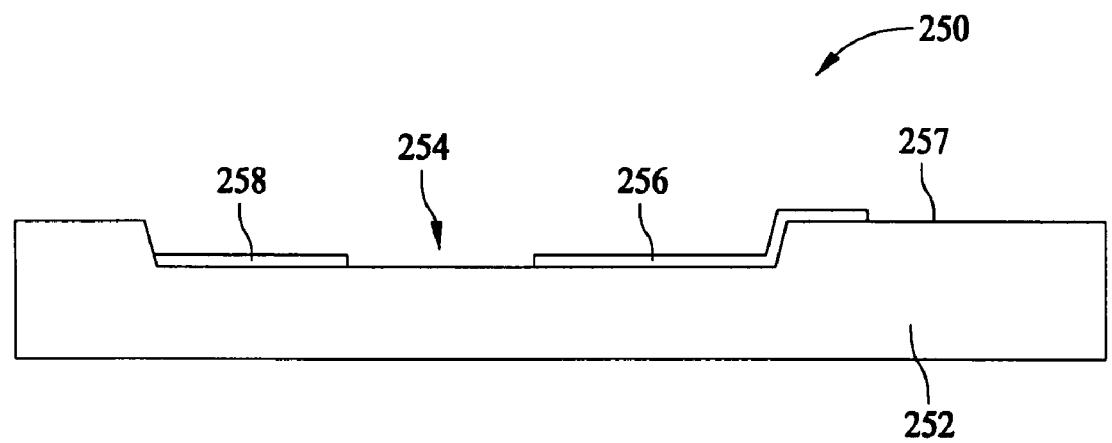
FIG. 13 illustrates interconnection metal (upper sense plates) being deposited on the substrate of FIG. 12.
Figure 14:
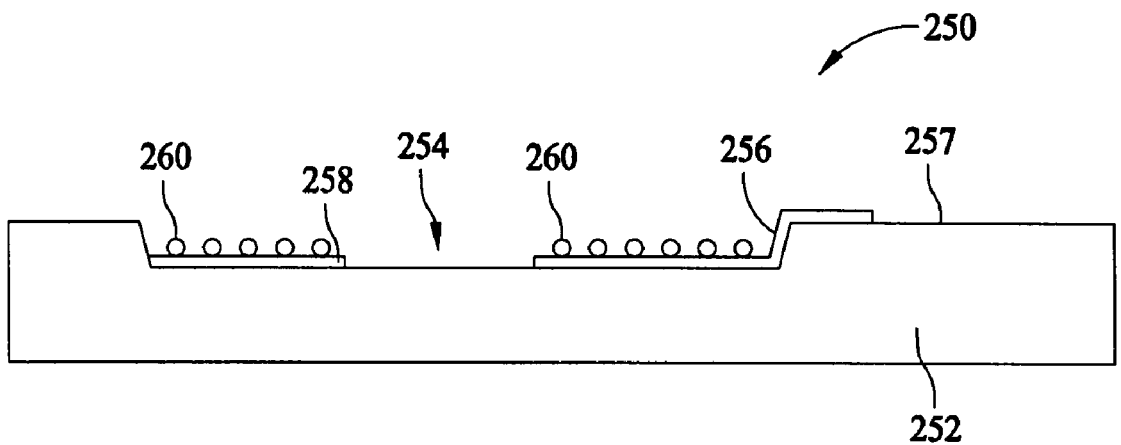
FIG. 14 illustrates anti-stiction metal being deposited on the interconnection metal of FIG. 13.

FIGS. 12-15 illustrate a process flow for construction of a top cap 250, which is to be bonded to device wafer 230 (shown in FIG. 11). The process flow is very similar to the process for device wafer 230. As shown in FIG. 12, top cap 250 includes a substrate 252, which includes one or more recesses 254 that are etched into substrate 252. Referring to FIG. 13, interconnect metal 256 and 258 is added to top cap 250. As an example, interconnect metal 256 extends out of recess 254 and onto surface 257 of substrate 252, for future electrical connection purposes. In one embodiment, interconnect metal 256 and 258 are to be configured as upper sense plates for a MEMS device. FIG. 14 shows anti-stick metal 260 being added to interconnect metal 256 and 258, to help prevent prolonged contact between interconnect metal 256 and 258 (upper sense plates) and one or more proof masses of the MEMS device.

Figure 15:
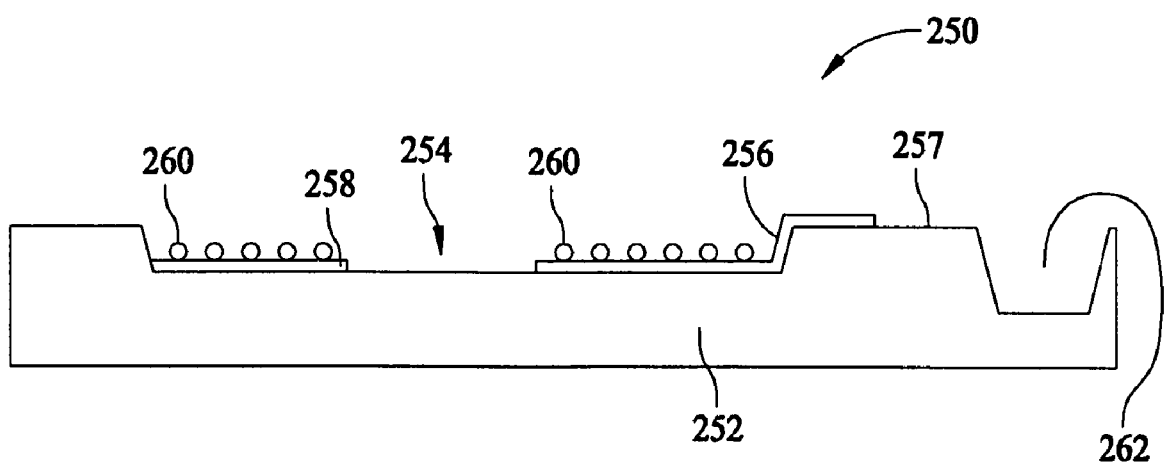
FIG. 15 illustrates a deep recess being formed in the substrate of FIG. 12.

In FIG. 15, top cap 250 is further configured with a deep recess 262 etched in a portion of surface 257. As further described below, deep recess 262 in substrate 252 is part of a process for providing access to bond pads of device wafer 230 (shown in FIG. 11). While shown as having a single recess 254 and single deep recess 262, it is understood that an exemplary top cap 250 is configured with multiple recesses 254 and deep recesses 262 depending on the number of individual MEMS components and electrical connections to be made to those components. In addition it is also understood that top cap 250 is a portion of an upper wafer which is bonded to device wafer 230, and diced into individual dies, as described above.

Figure 16:
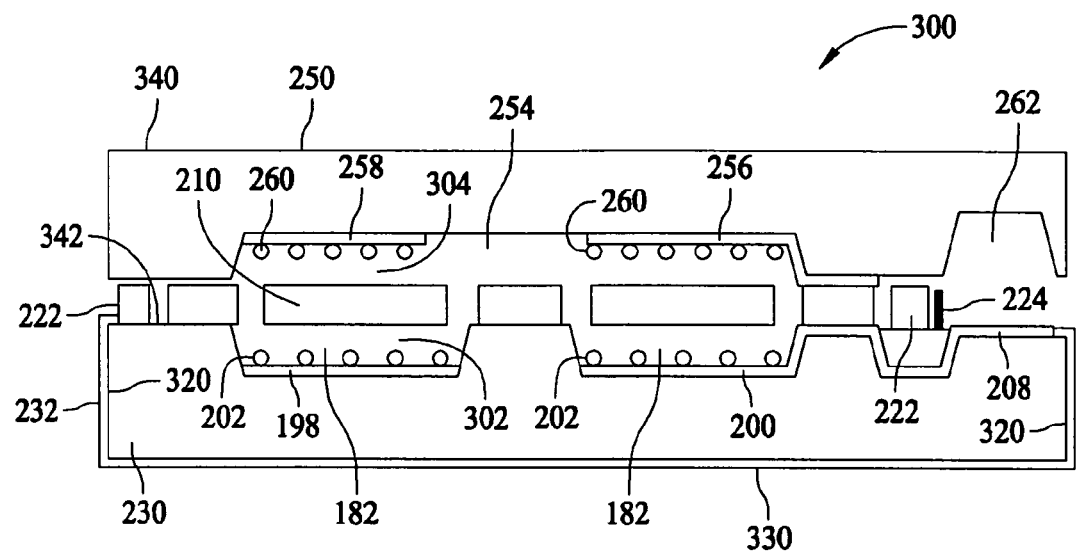
FIG. 16 is a side view of a MEMS device including the device wafer of FIG. 11 and the top cap of FIG. 15.
Figure 17:
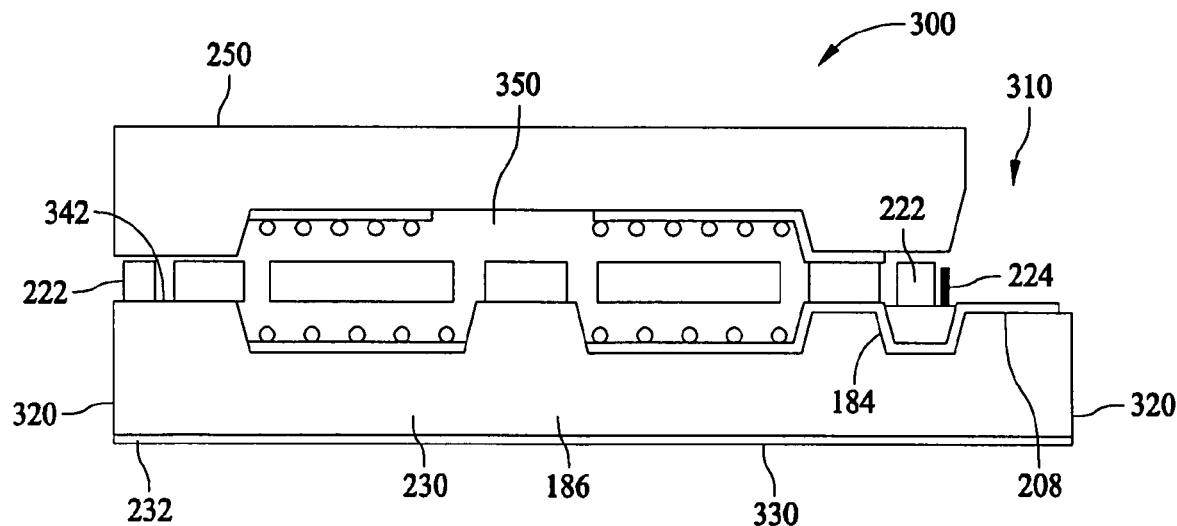
FIG. 17 illustrates the MEMS device of FIG. 16 where the substrate of FIG. 15 is sawed along the deep recess, providing access to electrical bond pads.

FIG. 16 illustrates a MEMS device 300 which includes device wafer 230 and top cap 250 and all of their above described respective components. Top cap 250 is bonded to support ring 222 around the perimeter of support ring 222. Top cap 250 is processed the same as glass portion 186 of device wafer 230, except that a gap 302 between proof mass 210 and lower sense plate 198 must match a gap 304 between proof mass 210 and upper sense plate 258, including their respective anti-stiction metal 202 and 260. To account for imperfections such as curvature of the silicon mechanism, and unequal exposure to etchants which, among other things, can slightly alter gaps 302 and 304, a depth of recess 254 in top cap 250 may be different than the depth of an etch in device wafer 230. In one embodiment, an etch time for top cap 205 is adjusted to accomplish equal gaps 302 and 304.

Anodic bonding of device wafer 230 to top cap 250 can be done by applying a high voltage between a back side 330 of wraparound metal layer 232 and a back side 340 of top cap 250. In the absence of wraparound metal layer 232, the voltage would be applied between device wafer 230 and top cap 250. The voltage required to make such a bond is twice the voltage needed when utilizing wraparound metal layer 232 and is higher than can be supplied by some commercial bonding systems without installation of a special power supply. More importantly, however, bonding processes which do not utilize wraparound metal layer 232 cause sodium to migrate out of device wafer 230 and deposit as a residue on the surface between device wafer 230 and top cap 250.

For proper operation of the subsequent MEMS devices 300, the residue must be removed, so a water rinse is required at some point after the bonding process. Unfortunately, it is very undesirable to get water into cavity 350 between the wafers, and it is not certain that the water rinse will remove all of the sodium residue. Therefore, in one embodiment, the bonding process which results in MEMS devices 300 is adjusted from bonding methods which do not utilize wraparound metal layer 232 and the sodium migration problem is alleviated as a result. Specifically, an electrical contact from back side 330 of device wafer 230, where it contacts a wafer bonder chuck and a power supply to the silicon layer on front side 340 of device wafer 230 is utilized (e.g. wrap around metal layer 232). Wrap around metal layer 232 is deposited on back side 330 of device wafer 230, but deposited such that metal layer 232 wraps around edges 320 and a small distance onto front side 342 as well. In one embodiment, wrap around layer 232 is applied by sputtering, as long as appropriate fixtures and control of a bias voltage for substrate 186 is supplied. Silicon and metal on device wafer 230 are arranged such that the bias voltage is distributed to all parts of device wafer 230, which lessens the incidence of sodium migration.

Deep recess 262, which is typically 100 micrometers deep or more, has been formed in top cap 250 as described above with respect to FIG. 15. When top cap 250 is aligned and bonded to device wafer 230, these deep recesses 262 will be directly above respective bond pads (electrical leads 208) of device wafer 230. After fabrication and bonding is complete, and referring to FIG. 17, access to electrical leads 208 is provided by sawing. Deep recess 262 allows top cap 250 to be sawed without the risk of getting the saw blade too close to device wafer 230. This process is sometimes referred to as cutting a "wide street" into top cap 250. Deep recesses can be made by ultrasonic drilling, as is known, but ultrasonic drilling can leave very rough edges. Other methods of providing an access area 310 to electrical leads 208 include chemical etching or laser drilling. Finally, the combination of top cap 250 and device wafer 230 are diced into individual dies, which is symbolized in FIG. 17 by showing that wrap around metal 232 stops at edges 320 of substrate 186.

In one embodiment, after top cap 250 and device wafer 230 are bonded together, there are two sawing operations. The first sawing operation includes sawing part way through top cap 250 to expose bond pads on device wafer 230. If the saw blade is lowered too much, there is a high risk that the saw blade will cut into device wafer 230. Deep recesses 262 are at a depth such that the saw blade can be easily set well above bond pads. Wider cuts that are needed for complete access to individual bond pads can be performed utilizing two parallel passes of a standard, narrow-kerf saw blade, or by a single pass of a wide-kerf blade.

The second sawing operation is to cut bonded top cap 250 and device wafer 230 into the individual dies. Preferably, any trenches below the support ring, for example, recess trench 184, or gaps in support ring 222 itself, are designed to prevent water and debris from entering cavity 350 during either of the sawing operations. In one embodiment, glass material 204 in recess 184 prevents water from getting past support ring 222 and into cavity 350.

The above described embodiments provide the known benefits of a top cap and an upper sense plate to a MEMS device in a format that is easily manufactured and which allows easy access to bond pads for electrically connecting to external devices. However, it is contemplated that the methods and structures described herein extend to applications other than those which involve application of top caps and upper sense plates to MEMS devices. For example, the wrap around metal layer and/or protective shields may also be utilized on MEMS device which do not utilize a top cap to provide other manufacturing or performance benefits.

The herein described methods also involve utilization of a support ring for supporting the top cap which helps to provide a better controlled environment for operation of the MEMS device therein, resulting in a more reliable operation. Therefore, while the invention has been described in terms of various specific embodiments, those skilled in the art will recognize that the invention can be practiced with modification within the spirit and scope of the claims.

What is claimed is:

1. A method for fabricating a micro-electromechanical systems (MEMS) device having a top cap and an upper sense plate, said method comprising:
   producing a device wafer including an etched substrate, etched silicon, and interconnect metal, a portion of the interconnect metal being bond pads;
   adding a metal wraparound layer to a back side, edges, and a portion of a front side of the device wafer;
   producing an upper wafer including an etched substrate and interconnect metal;
   bonding the device wafer and the upper wafer; and
   dicing the bonded upper wafer and device wafer into individual MEMS devices,
   wherein producing the device wafer includes forming a support ring around a perimeter of the MEMS device components, the support ring arranged to support the upper wafer.

2. A method according to claim 1 wherein producing a device wafer comprises:
   forming recesses on a glass substrate where conductive paths are to pass into the cavity;
   forming conductive leads in and around the recesses;
   depositing a glass layer into the recesses such that the glass layer is substantially level with a surface of the substrate.

3. A method according to claim 1 wherein adding a metal wraparound layer comprises:
   setting the device wafer in a fixture;
   applying a bias voltage to the substrate of the device wafer; and
   sputtering the wrap around metal layer onto the substrate.

4. A method according to claim 1 further comprising:
   adding recesses to the upper wafer, at positions above the bond pads after the bonding of the device wafer and the upper wafer; and
   cutting into the upper wafer at the recesses.

5. A method according to claim 4 wherein cutting into the upper wafer at the recesses comprises sawing part way through the top cap to expose the bond pads on the device wafer.

6. A method according to claim 1 wherein producing an upper wafer including an etched substrate and interconnect metal comprises configuring a portion of the interconnect metal as an upper sense plate.

7. A method according to claim 1 wherein the etched MEMS device components include at least one proof mass and wherein producing an upper wafer including an etched substrate and interconnect metal comprises:
   determining a distance between the proof mass and the interconnect metal in the device wafer configured as a sense plate;
   controlling a depth of the etching in the upper wafer such that the interconnect metal in the upper wafer to be configured as an upper sense plate will be substantially the same distance from the proof mass, after bonding, as the interconnect metal in the device wafer configured as a sense plate; and
   configuring a portion of the interconnect metal in the upper wafer as an upper sense plate.

8. A method according to claim 1 further comprising depositing anti-stick metal on at least a portion of the interconnect metal on the device wafer and the upper wafer.

9. A method according to claim 1 further comprising insulating the support ring from the interconnect metal.

10. A method according to claim 9 wherein insulating comprises forming a protective shield in the MEMS device to substantially prevent any particulates from electrically contacting the support ring.

11. A method for preventing electrical shorts in a MEMS device including at least one electrical interconnection passing under a support ring, the electrical interconnection being in a recessed trench and a material filling the trench onto which the support ring is mounted, said method comprising forming a protective shield near the support ring, the shield substantially preventing incidents of particles shorting the support ring to the electrical interconnection.

* * * * *